United States Patent
Iwaasa

(10) Patent No.: US 7,817,435 B2
(45) Date of Patent: Oct. 19, 2010

(54) ASSEMBLY STRUCTURE FOR POWER SUPPLY CIRCUIT UNIT OF ELECTRIC DEVICE

(75) Inventor: Hiroaki Iwaasa, Daito (JP)

(73) Assignee: Funai Electric Co., Ltd., Osaka (JP)

( * ) Notice: Subject to any disclaimer, the term of this patent is extended or adjusted under 35 U.S.C. 154(b) by 454 days.

(21) Appl. No.: 11/907,357

(22) Filed: Oct. 11, 2007

(65) Prior Publication Data

US 2008/0101009 A1    May 1, 2008

(30) Foreign Application Priority Data

Oct. 25, 2006    (JP)    ............... U2006-008678

(51) Int. Cl.
*H05K 5/00*    (2006.01)
(52) U.S. Cl. ............... 361/752; 361/730; 174/520
(58) Field of Classification Search ............... 361/752, 361/730, 728; 174/50, 520
See application file for complete search history.

(56) References Cited

U.S. PATENT DOCUMENTS

| 6,031,732 | A | * | 2/2000 | Koike et al. | ............... | 361/816 |
| 6,757,155 | B2 | * | 6/2004 | Koike et al. | ............... | 361/600 |
| 7,239,519 | B2 | * | 7/2007 | Guo et al. | ............... | 361/714 |
| 2003/0133273 | A1 | * | 7/2003 | Nagaoka | ............... | 361/752 |
| 2005/0068749 | A1 | * | 3/2005 | Watanabe | ............... | 361/752 |
| 2006/0250782 | A1 | * | 11/2006 | Lim et al. | ............... | 361/816 |

FOREIGN PATENT DOCUMENTS

| EP | 0-289-956 | 11/1988 |
| JP | 58-173892 A | 10/1983 |
| JP | 63-69086 A | 3/1988 |
| JP | 7-201163 A | 8/1995 |
| JP | 08-018255 | 1/1996 |
| JP | 10-242675 | 9/1998 |
| JP | 11-251075 | 9/1999 |

* cited by examiner

*Primary Examiner*—Dameon E Levi
(74) *Attorney, Agent, or Firm*—Morgan, Lewis & Bockius LLP

(57) ABSTRACT

A wiring substrate has a front face and a rear face opposed the front face. An electric component is mounted on the front face and is electrically connected to the wiring substrate at the rear face. A protection cover is comprised of a resin material and includes an upper plate, a lower plate and a connecting plate. The upper plate covers the electric component from above. The lower plate covers an electrical connection between the wiring substrate and the electric component from below. The connecting plate integrally connects the upper plate and the lower plate.

5 Claims, 4 Drawing Sheets

ASSEMBLY STRUCTURE FOR POWER SUPPLY CIRCUIT UNIT OF ELECTRIC DEVICE

The disclosure of Japanese Utility Model Application No. 2006-008678 filed Oct. 25, 2006 including specification, drawings and claims is incorporated herein by reference in its entirety.

BACKGROUND

The present invention relates to an assembly structure for a power supply circuit unit of an electric device, and more particularly, to the electric device in which the power supply circuit unit for handling a high voltage is accommodated in a housing made of a sheet metal. Specifically, the invention relates to the assembly structure for the power supply circuit unit of the electric device designed to improve safety and electric characteristics by extending a linear distance (gap) or a creeping distance between the housing and a tall component or soldering portion of the power supply circuit unit.

Recently, the housings of electric devices such as DVD drives have considerably miniaturized and flattened. For this reason, when the housings are made of a sheet metal, it is required to assure safety and electric characteristics in use by sufficiently extending a gap between a top plate, a bottom plate and a side plate of the housing and the power supply circuit unit accommodated in the housing or by sufficiently extending a creeping distance between the top plate, the bottom plate, and the side plate of the housing and the power supply circuit unit.

In the past, in order to assure safety and electric characteristics in use, there was proposed a method in which a gap between the housing and the top plate or the like is widened by allowing a height of a component such as a condenser in the power circuit unit to be lower as it could be. Alternatively, there was proposed another method in which an electric insulation material sheet is pasted on the rear surface or the like of the top plate of the housing.

It is known that a metal plate is used for a front or rear panel of a housing of an external memory device such as an optical disk (or example, see Patent Document 1). In addition to a proposal to improve an assembling process of an audio cabinet (for example, see Patent Document 2), a study for mounting a mechanism of a magnetic disk in the housing of a magnetic disk storage apparatus is conducted (for example, see Patent Document 3).

Patent Document 1: Japanese Patent Publication No. 7-201163A
Patent Document 2: Japanese Patent Publication No. 58-173892A
Patent Document 3: Japanese Patent Publication No. 63-69086A However, in the electric device of which the top plate, the bottom plate, and the side plate of the housing are made of a sheet metal, it is necessary to assure safety and electric characteristics in use and to achieve a miniaturization and a flatness of the housing. However, when a component such as a condenser, of which a size is large, is substituted by the relatively shorter component, the cost may increase because the short component is expensive. Additionally, when the insulation sheet is pasted on the rear surface of the top plate of the housing, the insulation sheet may peel off. As a result, when the insulation sheet peels off, a necessary safety and electric characteristics cannot be maintained.

That is, in the above-described methods disclosed in the Patent Documents 1 to 3, it is not possible to achieve a miniaturization and flatness of the housing while assuring safety and electric characteristics at the time of using the electric device unless the expensive shorter component is substituted for the taller component.

SUMMARY

It is therefore an object of the invention to provide an assembly structure for a power supply circuit unit of the electric device capable of assuring electric insulation between the power supply circuit unit and the housing that is miniaturized and flattened without substituting the expensive shorter component for the taller component by reforming the assembly structure for the power supply circuit unit accommodated in the housing. At the same time, the assembly structure for power supply circuit unit of the electric device can satisfies electric characteristics required for the electric device by sufficiently extending the creeping distance between the power supply circuit unit and the top plate or the like of the housing.

Another object of the invention is to provide the assembly structure for the power supply circuit unit of the electric device in which the electric insulation and the electric characteristics of the power supply circuit unit are fundamentally assured by covering the power supply circuit unit with the protection cover having electric insulation and also using the protection cover manufactured at low cost in a form of a incorporated member made of resin material.

In order to achieve the above described object, according to an aspect of the invention, there is provided an assembly structure for a power supply circuit unit of an electric device, comprising: a wiring substrate having a front face and a rear face opposed the front face; an electric component mounted on the front face and electrically connected to the wiring substrate at the rear face; and a protection cover comprised of a resin material and including: an upper plate covering the electric component from above; a lower plate covering an electrical connection between the wiring substrate and the electric component from below; and a connecting plate integrally connecting the upper plate and the lower plate.

With such a configuration, when the power supply circuit unit is accommodated in the housing that is miniaturized and flattened, the upper plate of the protection cover is interposed between the housing and top of the electric component, and the lower plate of the protection cover is interposed between the housing and the electrical connection. Accordingly, even when the housing is bent, the upper plate and the lower plate of the protection cover prevent a situation that the housing directly contacts with the electric component and the electrical connection. Also, the upper plate and the lower plate prevent a situation that the housing is electrically shorted to the electric component and the electrical connection. As a result, safety in use of the electric device is improved. Additionally, the upper plate and the lower portion of the protection cover are helpful for increasing a creeping distance between the housing and the electric component and the electrical connection, thereby improving electric characteristics. Moreover, since the protection cover has the upper plate, the lower plate, and the connecting plate integrally connecting the upper plate. and the lower plate, the protection cover can be integrally formed as a cheap integral molding member made of a resin material.

The electric device may have housing comprised of a sheet metal and having a top board, a bottom board, a rear board and a side board which define an inside corner accommodating the power supply circuit unit having the wiring substrate and the electric component; and the connecting plate of the protection cover may include a rear plate disposed between the power supply circuit unit and the rear board of the housing, and a side plate disposed between the power supply circuit unit and the side board of the housing. With the above configuration, the upper plate of the protection cover is interposed between the housing and the top of the electric component and the lower plate of the protection cover is interposed between the housing and the electrical connection. Additionally, the rear plate of the connecting plate of the protection cover is interposed between the rear board of the housing and the power supply circuit unit, and the side plate of the connecting plate is interposed between the side board of the housing and the power supply circuit unit. Accordingly, it is possible to further prevent a possibility that the housing directly contacts with the electric component and the electrical connection. Also, it is possible to securely prevent the situation that the housing is directly shorted to the electric component and the electrical connection. As a result, safety of the electric device is improved. Moreover, the rear plate and the side plate as well as the upper plate and the lower plate of the protection cover are also helpful for increasing a creeping distance between the housing and the electric component and the electrical connection.

The connecting plate of the protection cover may have a groove portion into which an edge of the wiring substrate is inserted, thereby positioning the edge in a thickness direction of the wiring substrate. Accordingly, since the protection cover and the wiring substrate are positioned in the thickness direction of the wiring substrate, the electric component does not interfere with the protection cover even when a vibration or a drop impact occurs.

A corner portion through which the rear plate of the protection cover may be continued to the side plate of the protection cover is opposite to the inside corner of the housing; and the lower plate of the protection cover may be disposed on the bottom board of the housing through a rib formed on the lower plate of the protection cover. Accordingly, since the connecting plate of the protection cover is provided with the corner portion, rigidity of the protection cover is improved. Moreover, since the corner portion is disposed in the inside corner of the housing and the lower plate of the protection cover is disposed on the bottom board of the housing through the rib formed on the lower plate of the protection cover, the protection cover is helpful for improving rigidity of the housing.

The rib may have a nonlinear shape. Accordingly, the rib is helpful for strengthening the lower plate of the protection cover.

The assembly structure for the power supply circuit unit of the electric device according to the invention can be implemented by employing a configuration in which the assembly structure for the power supply circuit unit of the electric device, comprises: a wiring substrate having a front face and a rear face opposed the front face; an electric component mounted on the front face and electrically connected to the wiring substrate at the rear face by soldering; and a protection cover comprised of a resin material and including: a planner upper plate covering the electric component from above; a planner lower plate covering an soldered electrical connection between the wiring substrate and the electric component from below; and a connecting plate integrally connecting the upper plate and the lower plate, wherein: the electric device has housing comprised of a sheet metal and having a top board, a bottom board, a rear board and a side board which define an inside corner accommodating the power supply circuit unit having the wiring substrate and the electric component; the connecting plate of the protection cover includes a rear plate disposed between the power supply circuit unit and the rear board of the housing, and a side plate disposed between the power supply circuit unit and the side board of the housing; the connecting plate of the protection cover has a groove portion into which an edge of the wiring substrate is inserted, thereby positioning the edge in a thickness direction of the wiring substrate; the groove portion is formed by removing a middle portion in a height direction of a rib which is formed on the rear plate; a corner portion through which the rear plate of the protection cover is continued to the side plate of the protection cover is opposite to the inside corner of the housing; and the lower plate of the protection cover is disposed on the bottom board of the housing through a rib having a nonlinear shape and formed on the lower plate of the protection cover.

As described above, according to the assembly structure for the power supply circuit unit of the electric device related to the invention, it is possible to securely prevent the housing from being shorted to the electric component or the electrical connection of the power supply circuit unit by the protection cover. As a result, a user can be protected from an electric shock occurring when touching the housing. Accordingly, it is possible to easily achieve a miniaturization and a flatness of the housing by approaching a top board of the housing to the electric components as close as possible without substituting the expensive shorter component instead of the taller component, that is, without substituting a shorter condenser instead a taller condenser. Additionally, the protection cover increases a creeping distance between the housing and the power supply circuit unit, so an electric noise from the power supply circuit unit to the outside decreases, thereby improving electric characteristics of the electric device. Moreover, the protection cover is integrally formed of a cheap resin material, so the protection cover strengthens the housing, thereby increasing an impact resistance when the housing is dropped.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF THE EMBODIMENTS

Hereinafter, embodiments of the invention will be described with reference to the drawings.

Figure 1:
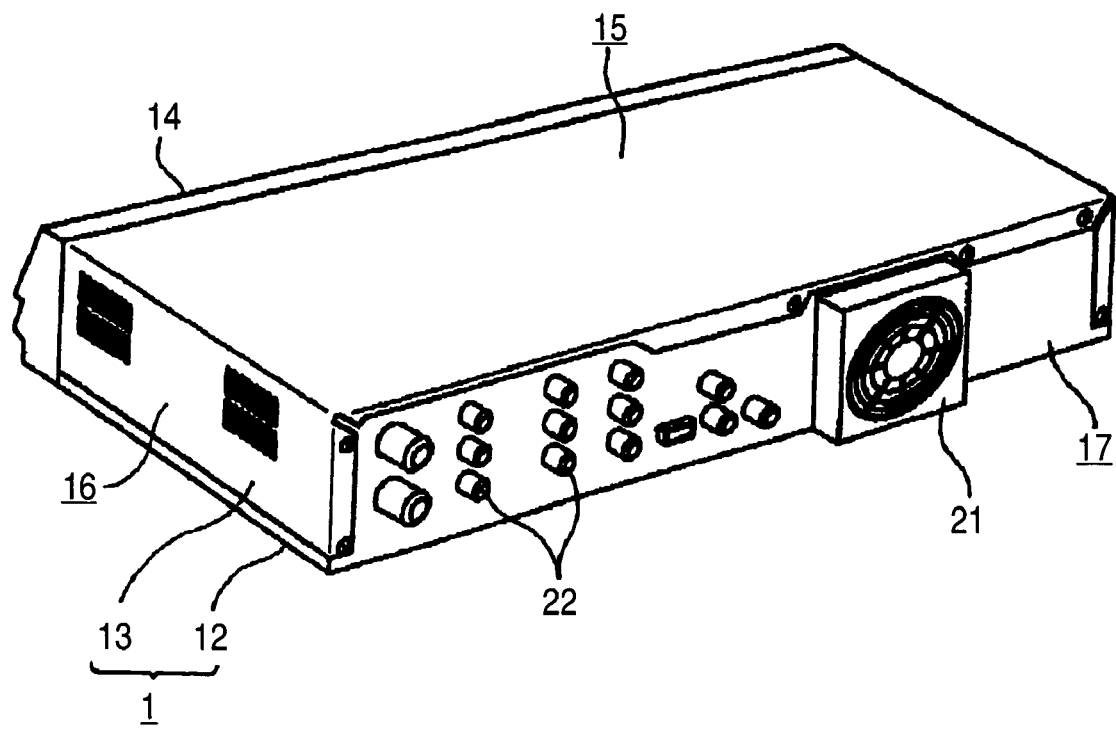
FIG. 1 is a perspective view showing an electric device employing an assembly structure for a power supply circuit unit according to an embodiment of the invention when viewed from a rear side thereof.

FIG. 1 is an external perspective view showing a DVD player which corresponds to an electric device employing an assembly structure for a power supply circuit unit according to the invention when viewed from a rear side thereof. As shown in FIG. 1, a flat thin housing 1 of the electric device receives the main body (not shown) and other necessary components of DVD drive, and one of the necessary components is a power supply circuit unit described below. The housing 1 includes a bottom cover 12 with a flat box-like shape and a top cover 13 which are made of a sheet metal, and a front panel 14 made of a resin material is disposed on a front end of the bottom cover 12 and the top cover 13. A top plate 15 of the housing 1 is formed by a top plate portion of the top cover 13. Side plates 16 on the left and right sides of the housing 1 are formed by a structure in which side plate portions constituting the top cover 15 and the bottom cover 14 come in contact with each other. A rear plate 17 of the housing 1 is formed by a rear plate portion of the bottom cover 14. A bottom plate (not shown) of the housing 1 is formed by a bottom plate portion of the bottom cover 14. Reference numeral 21 denotes a fan and Reference numeral 22 denotes a terminal group.

Figure 2:
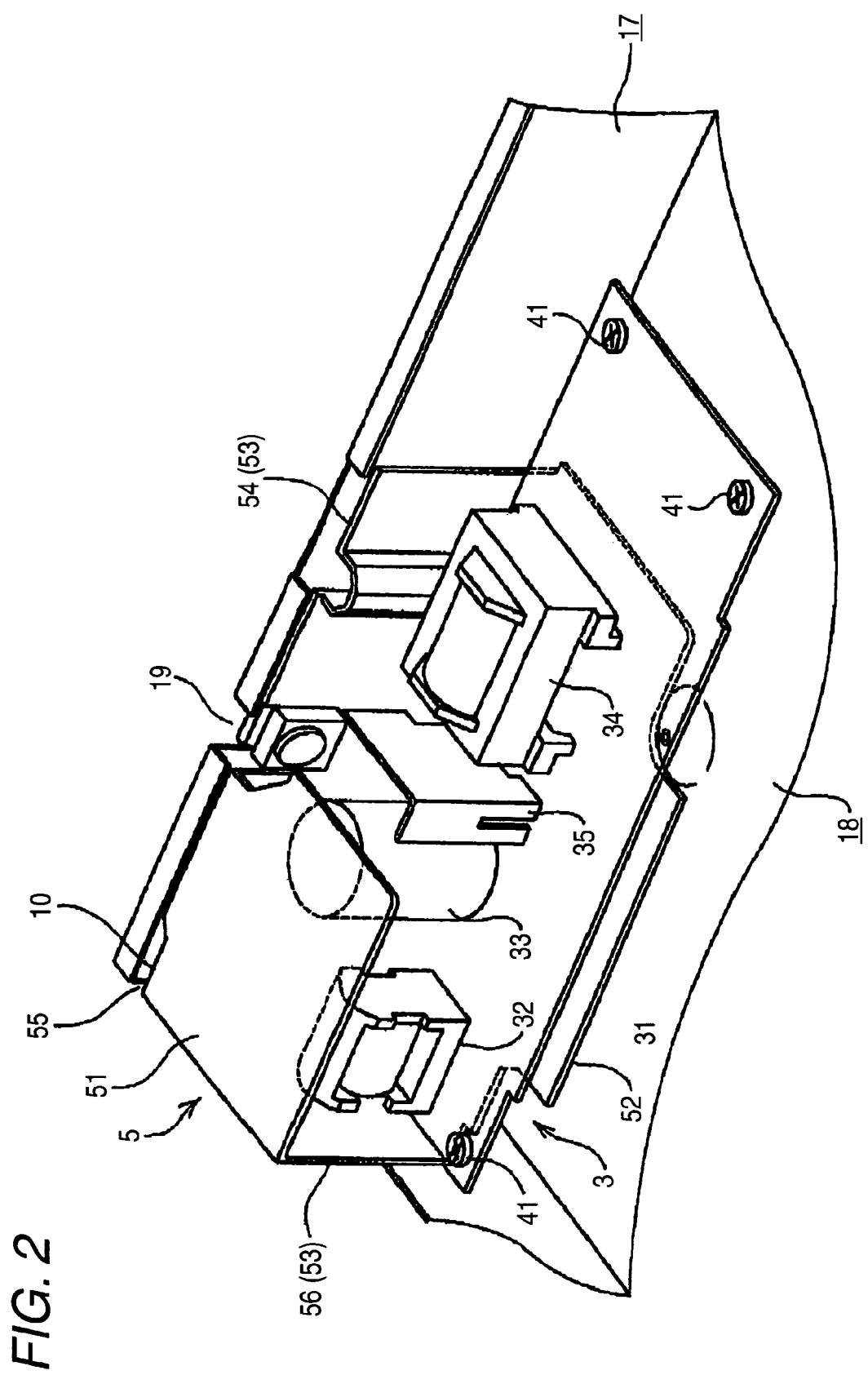
FIG. 2 is a schematic perspective view showing the power supply circuit unit.

FIG. 2 is a schematic perspective view showing a power supply circuit unit 3 and the like. In FIG. 2, the power supply circuit unit 3 is formed by mounting electric components such as a line filter 23, a condenser 33, and a transformer 34 and a heat sink 35 etc. on a wiring substrate 31 as a power substrate. The line filter 32 and the condenser 33 are included in a first power supply circuit and the transformer 34 is included in a second power supply circuit. The condenser 33 is the tallest component among the electric components constituting the power supply circuit unit 3 in the shown example. The power supply circuit unit 3 is fixed to the bottom plate 18 of the housing 1 using some attachment screws 41, and disposed on the inside corner portion that is formed in a manner of being enclosed by the top plate 15 (see FIG. 1), the bottom plate 18, the side plate 16 (see FIG. 1), and the rear plate 17 of the housing 1. At this time, a power cord (not shown) connected to the power supply circuit unit 3 is drawn to the outside via an outlet port 19 formed on the rear plate 17.

Figure 3:
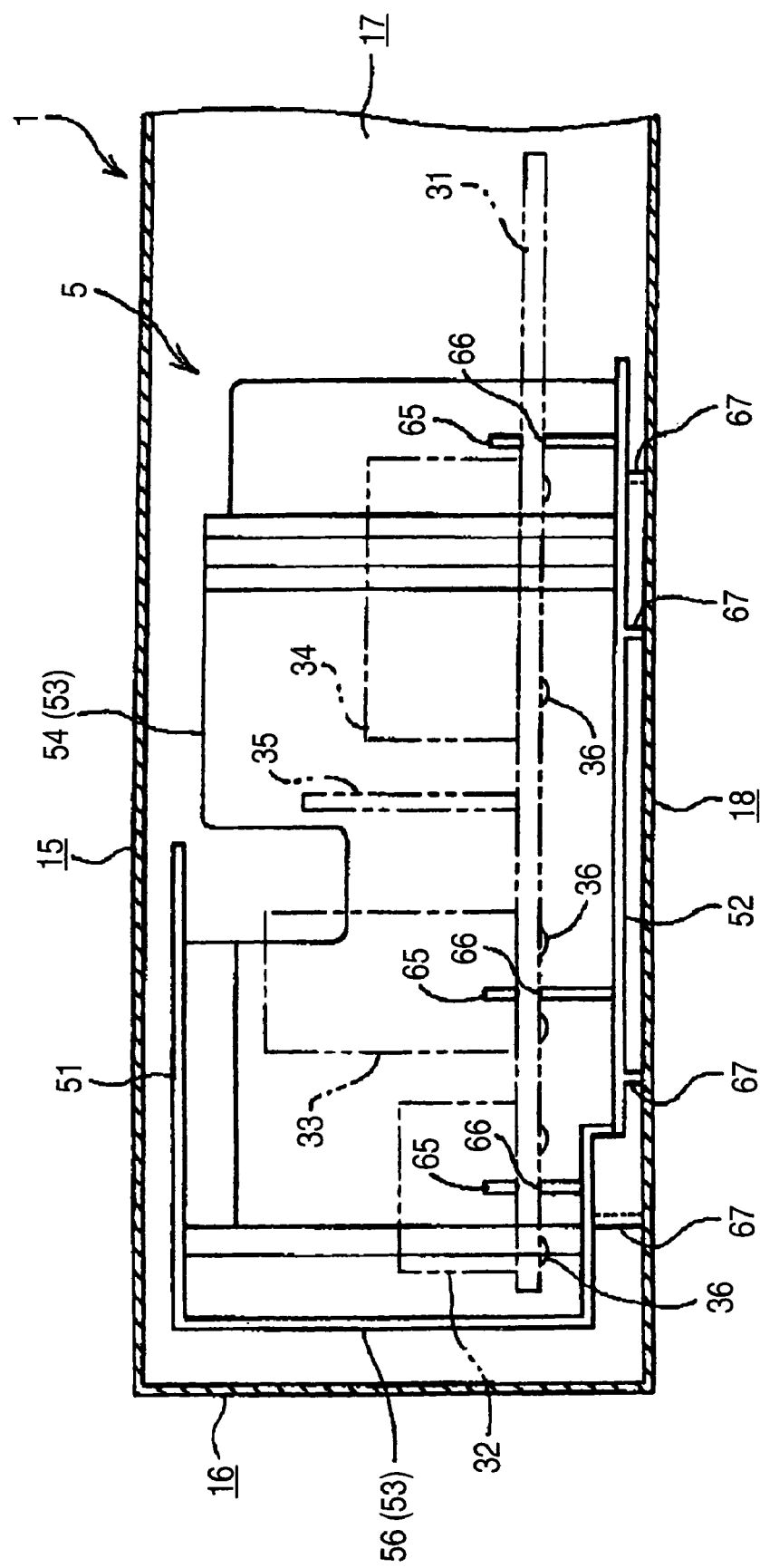
FIG. 3 is a longitudinal sectional front view showing a protection cover and a housing according to the embodiment.
Figure 4:
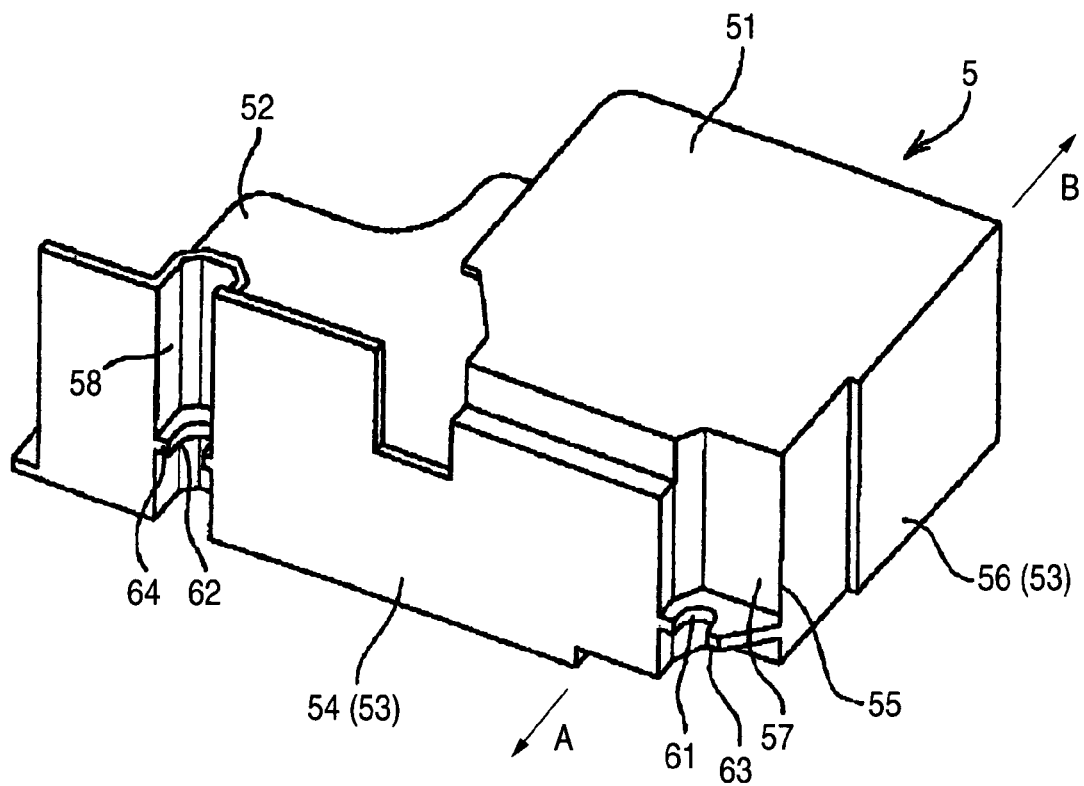
FIG. 4 is a perspective view showing the protection cover.

The power supply circuit unit 3 are covered by a protection cover 5 made of a resin material. FIG. 3 is a front view showing the protection cover 5. FIG. 4 is a perspective view showing the protection cover 5. As shown in FIGS. 3 and 4, the protection cover 5 includes a upper plate portion 51 with a substantially flat rectangular shape, a lower plat portion 52 that is formed in a substantially flat rectangular shape of which a width is narrower than that of the upper plate portion 51, and an upright plate portion 53 that is extending between the lower plate portion 52 and the upper plate portion 51. The upright plate portion 53 is provided with a narrow rear plate portion 54 that erects vertically from a rear edge of the lower plate portion 52 so as to allow a part of its upper edge to extend to the upper plate portion 51, and a side plate portion 56 that extends from the rear plate portion 54 with the corner portion 55 interposed therebetween and erects vertically from a side edge of the lower plate portion 52 so as to allow its upper edge to extend to the side edge of the upper plate portion 51. In addition, an inside corner 57 is formed outside the corner portion 55 and a groove 58 extending vertically is formed outside the rear plate portion 54. At this time, screw fixing pieces 63 and 64 that have attachment screw insertion holes 61 and 62 opened to the rear side thereof are integrally formed in the inside corner 57 and the concave groove 58. The inside corner 57 and the concave groove 58. are useful when the screw fixing pieces 63 and 64 are included in the protection cover 5 so as not to protrude from the rear plate portion 54 and when rigidity of the protection cover 5 is increased so as to improve its rigidity. As shown in FIG. 3, a plurality of ribs 65 are arranged at a predetermined interval on the inner surface of the rear plate portion 54. The edge of the wiring substrate 31 is allowed to be inserted into grooves 66 which are formed by removing middle portions of the vertical ribs 65. Also, seat portions 67 are integrally formed with the lower plate portion 52 by a rib, and the seat portions 67 strengthen the lower plate portion 52. In this embodiment, the rib forming the seat portions 67 includes a U-shaped part or an L-shaped part etc. extending from both sides of the U-shaped part, and is formed in a non-linear shape on a whole surface of the lower plate portion 52.

The protection cover 5, as shown in FIG. 2, is disposed so as to cover the wiring substrate 31 and the first electric component such as the condenser 33 mounted on the wiring substrate 31. In other words, the wiring substrate 31 is disposed in a space in which the upper plate portion 51 and the lower plate portion 52 of the protection cover 5 are opposed to each other before the wiring substrate 31 is fixed to the bottom plate 18 of the housing 1 using the screw. Subsequently, the first electric component such as the condenser 33, an electrical connection portion 36 (which is a soldering portion described below) connecting the electric component to the wiring substrate 31, and the like are disposed in the space. Subsequently, as shown in FIG. 2, the wiring substrate 31 is fixed to the bottom plate 18 of the housing an attachment screw 41, and the screw fixing pieces 63 and 64, which is shown in FIG. 4, of the protection cover 5 is fixed to the housing 1 using an attachment screw (not shown).

Figure 5:
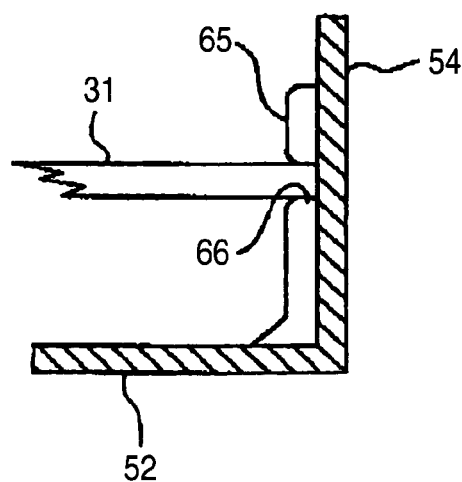
FIG. 5 is a longitudinal sectional side view showing a vertical rib and a groove portion according to the embodiment.

When the wiring substrate 31 and the protection cover 5 are fixed to the housing in this way, as shown in FIG. 3 or 5, the rear edge of the wiring substrate 31 is inserted in grooves 66 of the vertical ribs 65 on the side of the protection cover 5. Accordingly, the protection cover 5 and the wiring substrate 31 are positioned in a thickness direction of the wiring substrate 31. As a result, even when a vibration or a drop shock is applied, the electric component such as the condenser 33 does not interfere with the protection cover 5.

As shown in FIG. 2, in the housing 1, the corner portion 55 (see FIG. 4) of the protection cover 5 is disposed in a corner-shaped concave corner 10 of the inside corner of the housing 1. As shown in FIG. 3, the seat portions 67 provided on the lower plate portion 52 of the protection cover 5 overlaps with an inner surface of the bottom plate 18 of the housing 1.

As described above, when the housing 1 is provided with the protection cover 5 into which the power supply circuit unit 3 is inserted and the top plate 15 of the housing 1 moves to the electric component such as the condenser 33 of the power supply circuit unit 3 as close as possible in order to achieve a decrease in thickness and a flatness of the housing 1, as shown in FIG. 3, the upper plate portion 51 of the protection cover 5 is interposed between the top plate 15 of the housing 1 and the condenser 33 that is the tallest one among the electric components, and the lower plate 52 of the protection cover 5 is interposed between the bottom plate 18 of the housing 1 and the electrical connection portion (soldering portion) 36. With such a configuration, even when the housing 1 is bent by external force, the upper plate portion 51 and the lower plate portion 52 of the protection cover 5 prevent the top plate 15 and the bottom plate 18 from directly contacting with the condenser 33 and the electrical connection portion 36. Also, the upper plate portion 51 and the lower plate portion 52 of the protection cover 5 prevents the housing 1 from being shorted to the electric component such as the condenser 33 and the electrical connection portion 36 so that a user is protected from an electric shock. As a result, safety of the electric device is improved. The short preventing effect of the upper plate portion 51 and the lower plate portion 52 of the protection cover 5 is also exhibited by the side plate portion 56 and the rear plate portion 54 of the protection cover 5. That is, the side plate portion 56 prevents the side plate 16 of the housing 1 from contacting with the electric components, and the rear plate portion 54 prevents the rear plate 17 of the housing 1 from contacting with the electric components.

Further, since the protection cover 5 is configured to be interposed between the housing 1 and the power supply circuit unit 3, the protection cover 5 increases a creeping distance between the housing 1 and the power supply circuit unit 3 so that electric characteristics of the electric device is increased. That is, the upper plate portion 51 and the lower plate portion 52 of the protection cover 5 increase a creeping distance between the top plate 15 and the bottom plate 18 of the housing 1 and the electric component such as the condenser 33 and the electrical connection portion 36. Also, the side plate portion 56 and the rear plate portion 54 of the protection cover 5 increase a creeping distance between the side plate 16 and the rear plate 17 of the housing 1 and the electric component such as the condenser 33 and the electrical connection portion 36.

Furthermore, since the protection cover includes the upper plate portion, the lower plate portion, and the upright plate portion that is extending therebetween, the protection cover can be formed in a single member. As a result, the protection cover can be formed in an incorporated member using a cheap resin material.

In the embodiment, as shown in FIG. 2, the corner portion 55 of the protection cover 5 is configured to be disposed on the corner-shaped concave corner of the inside corner of the housing 1, and the seat portions 67 on the left side of the protection cover 5 are configured to overlap with an inner surface of the bottom plate 18 of the housing 1. With such a configuration, the corner portion 55 of the protection cover 5 contributes to increasing rigidity of the inside corner of the housing 1. As a result, the protection cover 5 prevents the inside corner of the housing 1 from being easily deformed due to a drop shock or the like.

Meanwhile, as described with reference to FIG. 4, the protection cover 5 has a shape provided with the upper plate portion 51, the lower plate portion 52, and the upright plate portion 53 that is extending therebetween, and the attachment screw insertion holes 61 and 62 of the screw fixing pieces 63 and 64 are opened to the rear side. With such a configuration, the protection cover 5 is formed in a single body by one process in order to be detached in two arrow directions A and B which are opposed to each other in FIG. 4. Accordingly, the protection cover 5 can be produced at a cheap cost, and an assembling cost is not expensive due to a simple assembling process even when the protection cover 5 is mounted on the power supply circuit unit 3 and the housing 1. For this reason, mass productivity of the electric device is not decreased because of further including the protection cover 5.

What is claimed is:

1. An assembly structure for a power supply circuit unit of an electric device, comprising:
   a wiring substrate having a front face and a rear face opposed the front face;
   an electric component mounted on the front face and electrically connected to the wiring substrate at the rear face by soldering; and
   a protection cover comprised of a resin material and including:
      a planner upper plate covering the electric component from above;
      a planner lower plate covering an soldered electrical connection between the wiring substrate and the electric component from below; and
      a connecting plate integrally connecting the upper plate and the lower plate, wherein:
   the electric device has housing comprised of a sheet metal and having a top board, a bottom board, a rear board and a side board which define an inside corner accommodating the power supply circuit unit having the wiring substrate and the electric component;
   the connecting plate of the protection cover includes a rear plate disposed between the power supply circuit unit and the rear board of the housing, and a side plate disposed between the power supply circuit unit and the side board of the housing;
   the connecting plate of the protection cover has a groove portion into which an edge of the wiring substrate is inserted, thereby positioning the edge in a thickness direction of the wiring substrate;
   the groove portion is formed by removing a middle portion in a height direction of a rib which is formed on the rear plate;
   a corner portion through which the rear plate of the protection cover is continued to the side plate of the protection cover is opposite to the inside corner of the housing; and
   the lower plate of the protection cover is disposed on the bottom board of the housing through a rib having a nonlinear shape and formed on the lower plate of the protection cover.

2. An assembly structure for a power supply circuit unit of an electric device, comprising:
   a wiring substrate having a front face and a rear face opposed the front face;
   an electric component mounted on the front face and electrically connected to the wiring substrate at the rear face; and
   a protection cover comprised of a resin material and including:
      an upper plate covering the electric component from above;
      a lower plate covering an electrical connection between the wiring substrate and the electric component from below; and
      a connecting plate integrally connecting the upper plate and the lower plate, wherein:
   the electric device has housing comprised of a sheet metal and having a top board, a bottom board, a rear board and a side board which define an inside corner accommodating the power supply circuit unit having the wiring substrate and the electric component; and
   the connecting plate of the protection cover includes a rear plate disposed between the power supply circuit unit and the rear board of the housing, and a side plate disposed between the power supply circuit unit and the side board of the housing.

3. An assembly structure for a power supply circuit unit of an electric device, comprising:
   a wiring substrate having a front face and a rear face opposed the front face;
   an electric component mounted on the front face and electrically connected to the wiring substrate at the rear face; and
   a protection cover comprised of a resin material and including:
      an upper plate covering the electric component from above;
      a lower plate covering an electrical connection between the wiring substrate and the electric component from below; and
      a connecting plate integrally connecting the upper plate and the lower plate, wherein the connecting plate of the protection cover has a groove portion into which an edge of the wiring substrate is inserted, thereby positioning the edge in a thickness direction of the wiring substrate.

4. The assembly structure as set forth in claim 2, wherein:
a corner portion through which the rear plate of the protection cover is continued to the side plate of the protection cover is opposite to the inside corner of the housing; and
the lower plate of the protection cover is disposed on the bottom board of the housing through a rib formed on the lower plate of the protection cover.

5. The assembly structure as set forth in claim 4, wherein the rib has a nonlinear shape.

* * * * *